United States Patent
Ito

(10) Patent No.: US 10,390,422 B2
(45) Date of Patent: Aug. 20, 2019

(54) PRINTED CIRCUIT BOARD AND ELECTRONIC APPARATUS

(71) Applicant: SEIKO EPSON CORPORATION, Tokyo (JP)

(72) Inventor: Masaaki Ito, Ina (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 15/914,052

(22) Filed: Mar. 7, 2018

(65) Prior Publication Data
US 2018/0270946 A1    Sep. 20, 2018

(30) Foreign Application Priority Data
Mar. 17, 2017 (JP) ................... 2017-052403

(51) Int. Cl.
*H05K 1/02* (2006.01)
*H05K 1/11* (2006.01)

(52) U.S. Cl.
CPC ........... *H05K 1/0206* (2013.01); *H05K 1/111* (2013.01); *H05K 1/0245* (2013.01);
(Continued)

(58) Field of Classification Search
CPC ... H05K 2201/093; H05K 2201/09309; H05K 2201/09318; H05K 2201/09327; H05K 2201/09354; H05K 2201/09145; H05K 2201/098; H05K 2201/10409; H05K 2201/09736; H05K 7/205; H05K 7/20509; H05K 7/2015; H05K 1/0204; H05K 1/0206; H05K 1/0207; H05K 1/0209; H05K 1/111; H05K 1/0245; H05K 2201/066; H05K 2201/09063; H05K 2201/10734
See application file for complete search history.

(56) References Cited

U.S. PATENT DOCUMENTS 4,628,407 A * 12/1986 August ............... H01L 23/36
                                                 361/711
5,363,280 A * 11/1994 Chobot ............... H05K 1/0201
                                                 174/266
(Continued)

FOREIGN PATENT DOCUMENTS

| JP | H02-41491 U | 3/1990 |
| JP | 2000-299564 A | 10/2000 |
| JP | 2016-119425 A | 6/2016 |

*Primary Examiner* — Roshn K Varghese
(74) *Attorney, Agent, or Firm* — Oliff PLC

(57) ABSTRACT

A printed circuit board includes a plurality of metal layers, a plurality of insulating layers provided between the respective metal layers of the plurality of metal layers, and an electronic device provided on one metal layer of the plurality of metal layers. The plurality of metal layers include a first outer metal layer and a second outer metal layer located on the outermost side of the plurality of metal layers and a plurality of intermediate metal layers located between the first outer metal layer and the second outer metal layer. At least one of the plurality of intermediate metal layers is a thick metal layer thicker than the first outer metal layer and the second outer metal layer. The thick metal layer is connected to one of a ground terminal of the electronic device and a power supply terminal of the electronic device.

17 Claims, 5 Drawing Sheets

(52) U.S. Cl.
CPC .......... *H05K 2201/066* (2013.01); *H05K 2201/09063* (2013.01); *H05K 2201/10409* (2013.01); *H05K 2201/10734* (2013.01)

(56) References Cited

U.S. PATENT DOCUMENTS

| | | | | |
|---|---|---|---|---|
| 5,371,653 | A * | 12/1994 | Kametani | H01L 23/467 |
| | | | | 174/252 |
| 6,353,540 | B1 * | 3/2002 | Akiba | H01L 23/5383 |
| | | | | 361/794 |
| 6,762,367 | B2 * | 7/2004 | Audet | H01L 23/49822 |
| | | | | 174/255 |
| 9,226,386 | B2 * | 12/2015 | Rotigni | H05K 1/0231 |
| 2002/0047193 | A1 * | 4/2002 | Dorfler | H01L 23/367 |
| | | | | 257/687 |
| 2002/0084524 | A1 * | 7/2002 | Roh | H01L 23/3128 |
| | | | | 257/738 |
| 2005/0183882 | A1 * | 8/2005 | Yun | H05K 3/4641 |
| | | | | 174/250 |
| 2009/0024345 | A1 * | 1/2009 | Prautzsch | H01L 23/34 |
| | | | | 361/720 |
| 2014/0226296 | A1 * | 8/2014 | Asano | H05K 1/0265 |
| | | | | 361/767 |
| 2016/0179135 | A1 | 6/2016 | Kumagai | |

* cited by examiner

PRINTED CIRCUIT BOARD AND ELECTRONIC APPARATUS

BACKGROUND

1. Technical Field

The present invention relates to a printed circuit board and electronic apparatus.

2. Related Art

Display systems of transmitting data to display devices such as projectors by information communication apparatuses using wireless communications have been known. The recent information communication apparatuses become faster and differential transmission of transmitting data using a pair of signal lines is often used in printed circuit boards within the information communication apparatuses. Further, this type of printed circuit board generates heat when mounted electronic devices operate and needs to have a heat dissipation structure that can efficiently release the heat of the electronic devices.

Patent Document 1 (JP-A-2000-299564) discloses a heat dissipation structure of a multilayer board including an inner-layer insulating layer, an internal heat-transfer layer, a surface-layer insulating layer, a heat generating element, and a via hole connecting the heat generating element and the internal heat-transfer layer. In the heat dissipation structure, the heat generated in the heat generating element is transferred to a metal case housing the multilayer board via the internal heat-transfer layer and the surface-layer insulating layer, and released to the outside.

In the heat dissipation structure of Patent Document 1, the internal heat-transfer layer is formed in a pattern provided between the inner-layer insulating layer and the surface-layer insulating layer. Further, to secure the insulating property of the heat generating element, a configuration of releasing heat of the internal heat-transfer layer via the surface-layer insulating layer is employed. The configuration has a problem of insufficient heat dissipation effect. To improve the heat dissipation effect, there is a conceivable method of providing a heatsink on the mounting surface of the heat generating element in the multilayer board, however, another problem of upsizing of the board is caused.

SUMMARY

An advantage of some aspects of the invention is to provide a printed circuit board not upsized with better heat dissipation effect of heat generated from an electronic device. Another advantage of some aspects of the invention is to provide an electronic apparatus including the printed circuit board.

A printed circuit board according to an aspect of the invention includes a plurality of metal layers, a plurality of insulating layers provided between the respective metal layers of the plurality of metal layers, and an electronic device provided in one metal layer of the plurality of metal layers. The plurality of metal layers include a first outer metal layer and a second outer metal layer located on the outermost side of the plurality of metal layers and a plurality of intermediate metal layers located between the first outer metal layer and the second outer metal layer. At least one of the plurality of intermediate metal layers is a thick metal layer thicker than the first outer metal layer and the second outer metal layer. The thick metal layer is connected to one of a ground terminal of the electronic device and a power supply terminal of the electronic device. And further, a printed circuit board according to an aspect of the invention includes a plurality of metal layers, a plurality of insulating layers provided between the respective metal layers of the plurality of metal layers, and an electronic device provided in one metal layer of the plurality of metal layers. The plurality of metal layers include a first outer metal layer and a second outer metal layer located on the outermost side of the plurality of metal layers and an intermediate metal layer located between the first outer metal layer and the second outer metal layer. The intermediate metal layer is a thick metal layer thicker than the first outer metal layer and the second outer metal layer. The thick metal layer is connected to one of a ground terminal of the electronic device and a power supply terminal of the electronic device.

In the printed circuit board according to the aspect of the invention, the heat generated in the electronic device is transferred to the thick metal layer connected to one of the ground terminal and the power supply terminal from the electronic device. Generally, the metal layer connected to the ground terminal or power supply terminal is not required to be a thin wiring pattern, but may be a solid pattern unlike the metal layer connected to a signal line or the like of the electronic device. The thick metal layer may have a wider area and a thicker thickness than the other metal layers, and thereby, thermal resistance is lower and heat is easily diffused inside. Therefore, according to the aspect of the invention, the printed circuit board not upsized with better heat dissipation effect may be provided.

The printed circuit board according to the aspect of the invention may further include a through hole penetrating the plurality of metal layers and the plurality of insulating layers, a heat dissipation member connected to the metal layer in which an opening portion of the through hole is provided, and a fixing member inserted into the through hole and fixing the heat dissipation member.

According to the configuration, the heat generated in the electronic device is transferred to the thick metal layer, and then, transferred to the heat dissipation member via the fixing member inserted into the through hole. Thereby, the heat can be released to the outside through the heat dissipation member, and the heat dissipation effect can be further improved compared to the case without the heat dissipation member.

The printed circuit board according to the aspect of the invention may further include a through hole penetrating a part of the plurality of metal layers and a part of the plurality of insulating layers, a heat dissipation member connected to the metal layer in which an opening portion of the through hole is provided, and a fixing member inserted into the through hole and fixing the heat dissipation member, wherein the thick metal layer may have an exposed region exposed to the outside by cutting out a part of at least one of the metal layers and a part of at least one of the insulating layers from a side of one metal layer of the first outer metal layer and the second outer metal layer toward a side of the other metal layer, the opening portion of the through hole may be provided in the exposed region of the thick metal layer, and the heat dissipation member may be connected to the thick metal layer in the exposed region.

According to this configuration, as is the case with the above described configuration, the heat can be released to the outside through the heat dissipation member, and the heat dissipation effect can be further improved compared to the case without the heat dissipation member. Further, in the case of the configuration, the thick metal layer has the exposed region exposed to the outside, and thereby, the heat dissipation effect can be further improved compared to the case where all of the thick metal layers are covered by the insulating layers and the metal layers.

The printed circuit board according to the aspect of the invention may further include a metallic coating layer provided along an inner wall of the through hole, wherein the thick metal layer and the heat dissipation member may be connected via the metallic coating layer.

According to this configuration, the heat is transferred from the thick metal layer to the heat dissipation member via the metallic coating layer provided along the inner wall of the through hole. Accordingly, the heat dissipation effect can be stably obtained independent of the heat conductivity or contact condition of the fixing member inserted into the through hole.

In the printed circuit board according to the aspect of the invention, the plurality of intermediate metal layers may include a plurality of the thick metal layers, and the plurality of thick metal layers may include a first thick metal layer connected to the ground terminal and a second thick metal layer connected to the power supply terminal.

According to this configuration, the heat generated in the electronic device is transferred to both the first thick metal layer and the second thick metal layer, and the heat dissipation effect can be significantly improved.

The printed circuit board according to the aspect of the invention may further include a differential transmission line formed as a part of the metal layer on which the electronic device is provided, the differential transmission line having a first wire and a second wire.

According to this configuration, the differential transmission line is provided, and thereby, fluctuations of characteristic impedance can be suppressed and reduction of signal quality may be suppressed. Further, the heat of the electronic device is efficiently released and stability of signal transmission can be secured.

An electronic apparatus according to an aspect of the invention includes the printed circuit board according to the aspect of the invention.

The electronic apparatus according to the aspect of the invention includes the printed circuit board according to the aspect of the invention, and is better in reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

As below, the first embodiment of the invention will be explained using FIGS. 1 to 4.

A printed circuit board of the embodiment includes a multilayer printed wiring board containing eight metal layers.

Figure 1:
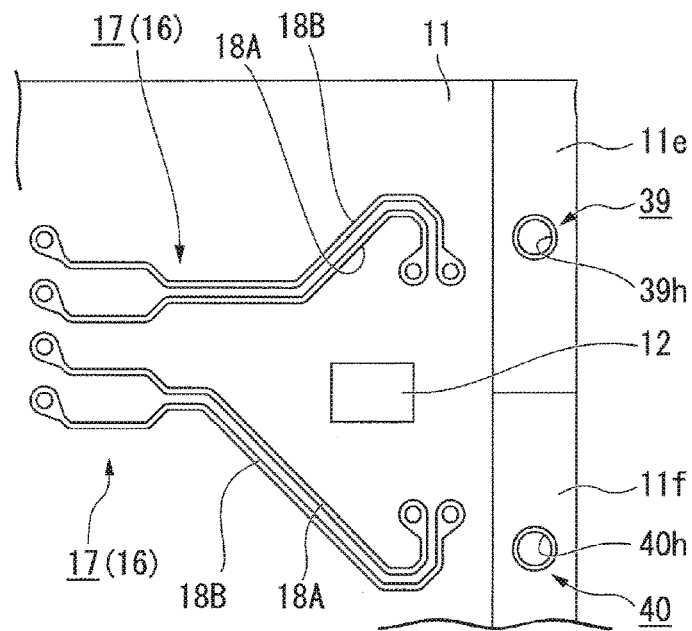
FIG. 1 is a plan view of a printed circuit board of the first embodiment.
Figure 2:
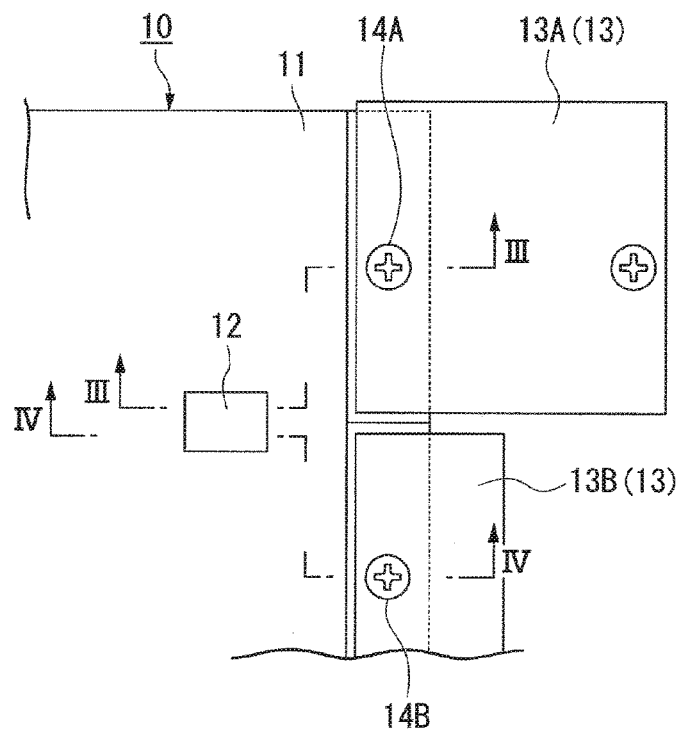
FIG. 2 is a plan view showing a state in which a heat dissipation member is connected to the printed circuit board.
Figure 3:
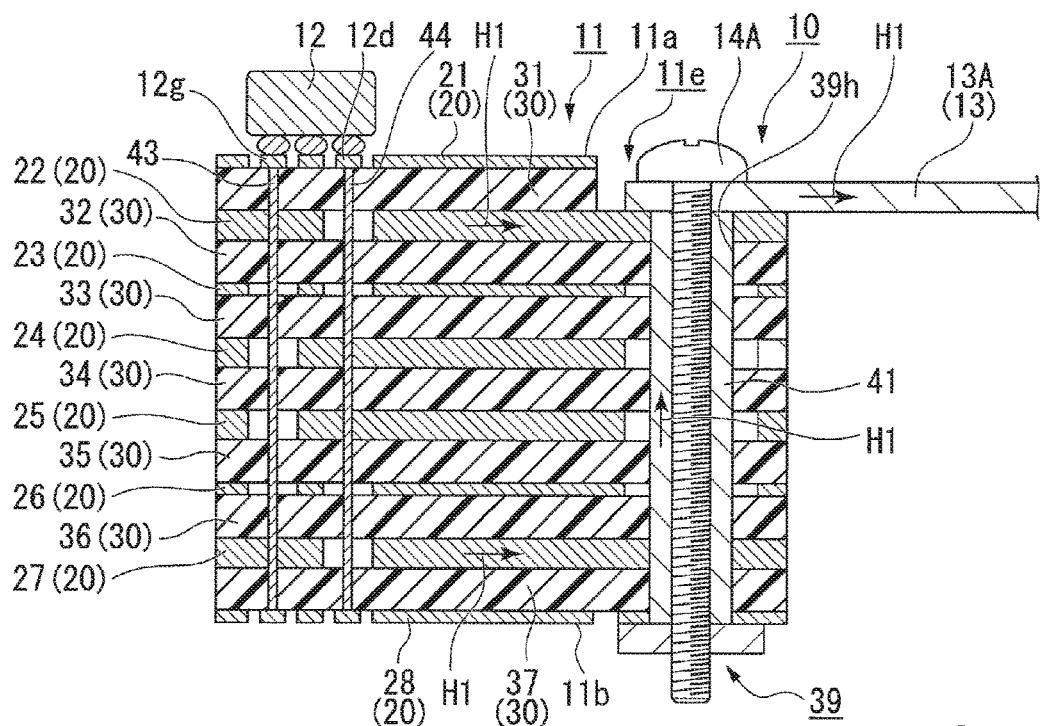
FIG. 3 is a sectional view along line in FIG. 2.
Figure 4:
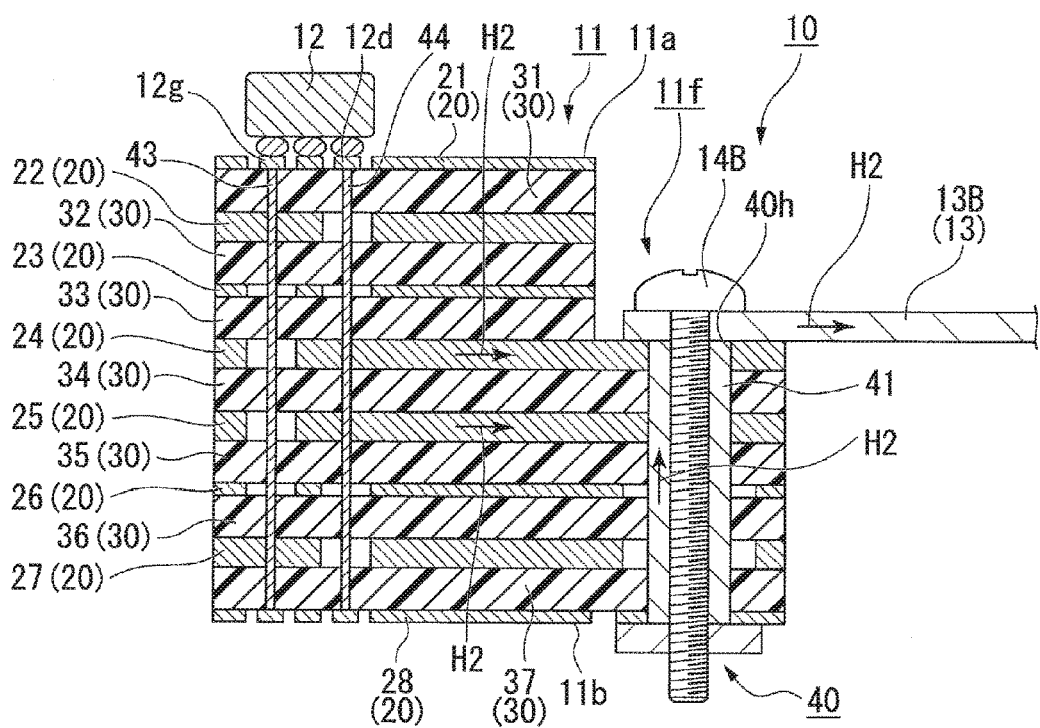
FIG. 4 is a sectional view along line IV-IV in FIG. 2.

FIG. 1 is a plan view of the printed circuit board of the embodiment. FIG. 2 is a plan view showing a state in which a heat dissipation member is connected to the printed circuit board. FIG. 3 is a sectional view along line III-III in FIG. 2. FIG. 4 is a sectional view along line IV-IV in FIG. 2.

In the respective drawings, for better visibility of the respective component elements, scaling of dimensions may be made different depending on the component elements.

Note that, in the specification, a board before mounting of electronic devices is referred to as "printed wiring board" and a board including members of electronic devices etc. after mounting and the printed wiring board is entirely referred to as "printed circuit board".

Configuration of Printed Circuit Board

As shown in FIGS. 1 to 4, a printed circuit board 10 includes a printed wiring board 11, an electronic device 12, a heat dissipation member 13, and fixing members 14A, 14B. The electronic device 12 is mounted on a first metal layer of the printed wiring board 11, which will be described later. The electronic device 12 is e.g. a system LSI called SoC (System on Chip) and a heavy-load and high-current-consumption semiconductor device. Note that, as the electronic device 12, not only the system LSI but also various devices are available.

As shown in FIGS. 3 and 4, the printed wiring board 11 includes a plurality of metal layers 20 and a plurality of insulating layers 30. These metal layers 20 and insulating layers 30 are stacked alternately one by one so that the outermost two layers in the printed wiring board 11 may be the metal layers 20. That is, the printed circuit board 10 includes the plurality of metal layers 20, the plurality of insulating layers 30 provided between the respective metal layers 20 of the plurality of metal layers 20, and the electronic device 12 provided in one metal layer 20 of the plurality of metal layers 20. Specifically, in the case of the embodiment, the printed wiring board 11 includes the eight metal layers 20 and the seven insulating layers 30.

In the specification, for convenience of explanation, the respective layers are referred to as a first metal layer 21, a first insulating layer 31, a second metal layer 22, a second insulating layer 32, a third metal layer 23, a third insulating layer 33, a fourth metal layer 24, a fourth insulating layer 34, a fifth metal layer 25, a fifth insulating layer 35, a sixth metal layer 26, a sixth insulating layer 36, a seventh metal layer 27, a seventh insulating layer 37, and an eighth metal layer 28 from the side of a first surface 11a to the side of a second surface 11b of the printed wiring board 11 on which the electronic device 12 is mounted.

The plurality of metal layers 20 include a front-side metal layer (first outer metal layer) and a back-side metal layer (second outer metal layer) located on the outermost side in the stacking direction of the printed wiring board 11 in the plurality of metal layers 20, and intermediate metal layers located between the front-side metal layer and the back-side metal layer. In the case of the embodiment, the first metal layer 21 is the front-side metal layer, the eighth metal layer 28 is the back-side metal layer, and the six metal layers 20 from the second metal layer 22 to the seventh metal layer 27 are the intermediate metal layers. Note that, in the specification, regarding the front-side metal layer and the back-side metal layer, only for convenience of explanation, the metal layer 20 on the side on which the electronic device 12 is mounted is referred to as the front-side metal layer and the metal layer 20 on the opposite side to the side on which the electronic device 12 is mounted is referred to as the back-side metal layer, and the names do not particularly limit the placement form of the printed circuit board 10 or the like.

At least one metal layer of the intermediate metal layers is a thick metal layer thicker than the first metal layer 21 as the front-side metal layer and the eighth metal layer 28 as the back-side metal layer. In the embodiment, the second metal layer 22, the fourth metal layer 24, the fifth metal layer 25, and the seventh metal layer 27 are thick metal layers. Further, in the embodiment, the second metal layer 22, the fourth metal layer 24, the fifth metal layer 25, and the seventh metal layer 27 as the thick metal layers are thicker than the third metal layer 23 and the sixth metal layer 26 as the other intermediate metal layers. As examples of the thicknesses, the thicknesses of the first metal layer 21, the third metal layer 23, the sixth metal layer 26, and the eighth metal layer 28 are 35 µm. On the other hand, the thicknesses of the second metal layer 22, the fourth metal layer 24, the fifth metal layer 25, and the seventh metal layer 27 as the thick metal layers are 70 µm. The plurality of metal layers 20 are formed using a metal material e.g. copper or the like. It is preferable to use a material with better electrical conductivity and heat conductivity as the metal material.

Though not shown in the sectional views of FIGS. 3 and 4, the first metal layer 21, the third metal layer 23, the sixth metal layer 26, and the eighth metal layer 28 are respectively connected to signal terminals of the electronic device 12. Accordingly, the first metal layer 21, the third metal layer 23, the sixth metal layer 26, and the eighth metal layer 28 are respectively formed as wiring patterns.

In FIG. 1, of these wiring patterns, apart of a wiring pattern 16 formed by the first metal layer 21 is shown. As shown in FIG. 1, the printed wiring board 11 includes a differential transmission lines 17 formed as apart of the first metal layer 21 on which the electronic device 12 is provided as the wiring pattern 16. The differential transmission line 17 has a first wire 18A and a second wire 18B extending nearly in parallel to each other.

As shown in FIGS. 3 and 4, the respective thick metal layers of the second metal layer 22, the fourth metal layer 24, the fifth metal layer 25, and the seventh metal layer 27 are connected to one of a ground terminal 12g and a power supply terminal 12d of the electronic device 12. In the embodiment, the respective thick metal layers (first thick metal layers) of the second metal layer 22 and the seventh metal layer 27 are connected to the ground terminal 12g of the electronic device 12.

On the other hand, the respective thick metal layers (second thick metal layers) of the fourth metal layer 24 and the fifth metal layer 25 are connected to the power supply terminal 12d of the electronic device 12. That is, in the embodiment, the thick metal layers include the first thick metal layers connected to the ground terminal 12g of the electronic device 12 and the second thick metal layers connected to the power supply terminal 12d of the electronic device 12. Accordingly, the second metal layer 22, the fourth metal layer 24, the fifth metal layer 25, and the seventh metal layer 27 are respectively formed as solid patterns. That is, in a plan view of the printed wiring board 11 from the normal direction of the first surface 11a, the second metal layer 22, the fourth metal layer 24, the fifth metal layer 25, and the seventh metal layer 27 are respectively provided in nearly the same sizes as that of the outer shape of the printed wiring board 11 in the plan view.

The materials and thicknesses of the plurality of insulating layers 30 are not particularly limited. As the materials of the insulating layers 30, e.g. resin materials including epoxy, polyimide, glass epoxy may be used. The thicknesses of the insulating layers 30 are e.g. from about 20 µm to 2 mm. The plurality of insulating layers 30 may be formed using the same insulating material or a combination of a core material and prepreg used in a general printed wiring board.

As shown in FIG. 1, in the printed wiring board 11, the second metal layer 22 and the fourth metal layer 24 as the thick metal layers have a first exposed region 11e and a second exposed region 11f respectively partially exposed to the outside. The first exposed region 11e is a region in which the second metal layer 22 as one of the thick metal layers is exposed to the outside. The second exposed region 11f is a region in which the fourth metal layer 24 as one of the thick metal layers is exposed to the outside. In the embodiment, the first exposed region 11e and the second exposed region 11f respectively have rectangular shapes in the plan view of the printed wiring board 11 from the normal direction of the first surface 11a and are provided in positions adjacent to each other. Note that the shapes, placements, etc. of the first exposed region 11e and the second exposed region 11f are not particularly limited.

The printed wiring board 11 includes a first through hole 39 and a second through hole 40. An opening portion 39h of the first through hole 39 is provided in the first exposed region 11e of the second metal layer 22 as the thick metal layer. Further, an opening portion 40h of the second through hole 40 is provided in the second exposed region 11f of the fourth metal layer 24 as the thick metal layer. In the embodiment, the single through holes 39, 40 are provided in the respective exposed regions 11e, 11f, however, two or more through holes may be provided in the respective exposed regions 11e, 11f and the number of through holes is not particularly limited.

As shown in FIG. 3, in the first exposed region 11e, the second metal layer 22 is exposed to the outside by cutting out a part of the first metal layer 21 and a part of the first insulating layer 31 from the side of the first metal layer 21 (first outer metal layer) as the front-side metal layer toward the side of the eighth metal layer 28 (second outer metal layer) as the back-side metal layer. Further, the first through hole 39 is provided to penetrate the second metal layer 22, the second insulating layer 32, the third metal layer 23, the third insulating layer 33, the fourth metal layer 24, the fourth insulating layer 34, the fifth metal layer 25, the fifth insulating layer 35, the sixth metal layer 26, the sixth insulating layer 36, the seventh metal layer 27, the seventh insulating layer 37, and the eighth metal layer 28.

As shown in FIG. 4, in the second exposed region 11f, the fourth metal layer 24 is exposed to the outside by cutting out a part of the first metal layer 21, a part of the first insulating layer 31, a part of the second metal layer 22, a part of the second insulating layer 32, a part of the third metal layer 23, and a part of the third insulating layer 33 from the side of the first metal layer 21 as the front-side metal layer toward the side of the eighth metal layer 28 as the back-side metal layer. Further, the second through hole 40 is provided to penetrate the fourth metal layer 24, the fourth insulating layer 34, the fifth metal layer 25, the fifth insulating layer 35, the sixth metal layer 26, the sixth insulating layer 36, the seventh metal layer 27, the seventh insulating layer 37, and the eighth metal layer 28.

That is, the first exposed region 11e of the second metal layer 22 and the second exposed region 11f of the fourth metal layer 24 are exposed to the outside by cutting out a part of at least one metal layer 20 and a part of at least one insulating layer 30 from the first outer metal layer side toward the second outer metal layer side. Further, the first through hole 39 and the second through hole 40 penetrate a part of the plurality of metal layers 20 and a part of the plurality of insulating layers.

Note that, in the embodiment, the first exposed region 11e and the second exposed region 11f are provided by cutting out a part of at least one metal layer 20 and a part of at least one insulating layer 30 from the first outer metal layer side toward the second outer metal layer side, however, not limited to that. The first exposed region 11e and the second exposed region 11f may be provided by cutting out apart of at least one metal layer 20 and a part of at least one insulating layer 30 from the second outer metal layer side toward the first outer metal layer side. That is, the first exposed region 11e and the second exposed region 11f are provided by cutting out a part of the metal layers 20 and a part of the insulating layers 30 from the side of one metal layer of the first outer metal layer and the second outer metal layer toward the side of the other metal layer.

As shown in FIG. 2, the heat dissipation member 13 includes a first heat dissipation member 13A and a second heat dissipation member 13B. The first heat dissipation member 13A is formed using e.g. a plate and may be connected to a casing or the like of an electronic apparatus on which the printed circuit board 10 is mounted. Similarly, the second heat dissipation member 13B is formed using e.g. a plate and may be connected to a part of the electronic apparatus on which the printed circuit board 10 is mounted. As described above, when the heat dissipation member 13 is further connected to another member, heat may be dissipated via the other member. The first heat dissipation member 13A is connected to the ground terminal 12g and the second heat dissipation member 13B is connected to the power supply terminal 12d, and thereby, it is necessary that the first heat dissipation member 13A and the second heat dissipation member 13B are electrically insulated.

As shown in FIG. 3, the first heat dissipation member 13A is connected to the second metal layer 22 in which the opening portion 39h of the first through hole 39 is provided in the first exposed region 11e. The fixing member 14A is inserted into the first through hole 39 and fixes the first heat dissipation member 13A to the printed wiring board 11. As the fixing member 14A, a metal screw is used.

As shown in FIG. 4, the second heat dissipation member 13B is connected to the fourth metal layer 24 in which the opening portion 40h of the second through hole 40 is provided in the second exposed region 11f. That is, the first heat dissipation member 13A and the second heat dissipation member 13B are connected to the second metal layer 22 and the fourth metal layer 24 as the thick metal layers in the first exposed region 11e and the second exposed region 11f, respectively. The fixing member 14B is inserted into the second through hole 40 and fixes the second heat dissipation member 13B to the printed wiring board 11. As the fixing member 14B, a metal screw is used like the fixing member 14A.

Further, as shown in FIGS. 3 and 4, the printed wiring board 11 includes metallic coating layers 41 respectively inside of the first through hole 39 and the second through hole 40. The metallic coating layers 41 are respectively provided along the inner walls of the first through hole 39 and the second through hole 40. As shown in FIG. 3, the metallic coating layer 41 is connected to the second metal layer 22 in the first exposed region 11e and connected to the seventh metal layer 27 inside of the first through hole 39. Further, the metallic coating layer 41 is connected to the first heat dissipation member 13A in the first exposed region 11e. That is, the thick metal layers of the second metal layer 22 and the seventh metal layer 27 and the first heat dissipation member 13A are connected via the metallic coating layer 41.

As shown in FIG. 4, the metallic coating layer 41 is connected to the fourth metal layer 24 in the second exposed region 11f and connected to the fifth metal layer 25 inside of the second through hole 40. Further, the metallic coating layer 41 is connected to the second heat dissipation member 13B in the second exposed region 11f. That is, the thick metal layers of the fourth metal layer 24 and the fifth metal layer 25 and the second heat dissipation member 13B are connected via the metallic coating layer 41.

The metallic coating layer 41 is formed using e.g. a metal material such as copper. It is preferable to use a material with better heat conductivity as the metal material. It is preferable that the thickness of the metallic coating layer 41 is a thickness that brings the fixing member 14 and the metallic coating layer 41 into contact when the fixing member 14 is inserted into the first through hole 39 or second through hole 40. The metallic coating layer 41 is formed using e.g. plating, and thereby, the thickness of the metallic coating layer 41 may be adjusted.

Note that, in the embodiment, as shown in FIGS. 3 and 4, the metallic coating layers 41 are provided in contact with the fixing members 14A, 14B respectively inserted into the first through hole 39 and the second through hole 40, however, actually, spaces (not shown) exist between the fixing members 14A, 14B and the metallic coating layers 41 because of tolerance design that makes the respective inner diameters of the first through hole 39 and the second through hole 40 containing the metallic coating layers 41 larger than the outer diameters of the screw portions of the fixing members 14A, 14B.

The ground terminal 12g of the electronic device 12 is connected to the second metal layer 22 and the seventh metal layer 27 as the thick metal layers via a first via 43. Accordingly, the first via 43 is insulated from the third metal layer 23, the fourth metal layer 24, the fifth metal layer 25, and the sixth metal layer 26. The power supply terminal 12d of the electronic device 12 is connected to the fourth metal layer 24 and the fifth metal layer 25 as the thick metal layers via a second via 44. Accordingly, the second via 44 is insulated from the second metal layer 22, the third metal layer 23, the sixth metal layer 26, and the seventh metal layer 27.

The printed circuit board 10 having the above described configuration can be manufactured using e.g. a cutting method or laminating method (inner layer resist method). When the cutting method is used, a multilayer printed wiring board without the first exposed region 11e or second exposed region 11f is once manufactured, and then, the outer insulating layers and metal layers may be cut from the second metal layer 22 and the fourth metal layer 24 until the second metal layer 22 and the fourth metal layer 24 are exposed. Further, when the laminating method is used, insulating layers and metal layers having smaller areas than the second metal layer 22 and the fourth metal layer 24 in the plan view from the normal direction of the first surface of a multilayer printed wiring board are formed in advance, and the layers may be sequentially laminated on the second metal layer 22 and the fourth metal layer 24. In view of the number of manufacturing steps and manufacturing cost, the cutting method is desirably used.

Heat Conduction Path

In FIG. 3, an arrow H1 shows a conduction path of heat generated in the electronic device 12 via the ground terminal 12g. The heat generated in the electronic device 12 is transferred to the second metal layer 22 and the seventh metal layer 27 to which the ground terminal 12g is connected via the ground terminal 12g and the first via 43. The heat transferred to the second metal layer 22 and the seventh metal layer 27 is transferred to the first heat dissipation member 13A fixed to the second metal layer 22 in the first exposed region 11e via the metallic coating layer 41 and the fixing member 14A.

In FIG. 4, an arrow H2 shows a conduction path of heat generated in the electronic device 12 via the power supply terminal 12d. The heat generated in the electronic device 12 is transferred to the fourth metal layer 24 and the fifth metal layer 25 to which the power supply terminal 12d is connected via the power supply terminal 12d and the second via 44. The heat transferred to the fourth metal layer 24 and the fifth metal layer 25 is transferred to the second heat dissipation member 13B fixed to the fourth metal layer 24 in the second exposed region 11f via the metallic coating layer 41 and the fixing member 14B. The heat transferred to the heat dissipation member 13 is dissipated directly to the outside from the heat dissipation member 13 or, when the heat dissipation member 13 is connected to another member, dissipated via the other member to the outside.

In the printed wiring board 11 of the embodiment, the first metal layer 21 is located on the outer surface and originally exposed to the outside, and accordingly, for example, if the thickness of the first metal layer 21 may be made thicker the heat dissipation effect may be improved. However, in the case where a high-speed data transfer wire like the differential transmission line 17 shown in FIG. 2 is provided on the printed wiring board 11, it is necessary to adjust the impedance value of the differential transmission line 17 depending on the thickness of the first metal layer 21, and the degree of freedom of the thickness adjustment of the first metal layer 21 is lower and it may be impossible to unduly make the first metal layer 21 thicker.

Accordingly, in the embodiment, the thick metal layers of the second metal layer 22, the fourth metal layer 24, the fifth metal layer 25, and the seventh metal layer 27 that transfer the heat generated in the electronic device 12 are thicker than the front-side metal layer (first metal layer 21) and the back-side metal layer (eighth metal layer 28). Further, these thick metal layers are thicker than the other intermediate metal layers. Furthermore, these thick metal layers are connected to the ground terminal 12g or power supply terminal 12d of the electronic device 12, and thereby, may take the areas wider than the front-side metal layer, the back-side metal layer, and the other intermediate metal layers. Accordingly, these thick metal layers have sufficiently lower heat resistances than the front-side metal layer, the back-side metal layer, and the other intermediate metal layers, and heat is easily diffused inside. Therefore, according to the embodiment, the printed circuit board 10 not upsized with better heat dissipation effect may be provided.

In the embodiment, the second metal layer 22 and the fourth metal layer 24 are the intermediate metal layers of the printed wiring board 11, and include the first exposed region 11e and the second exposed region 11f by cutting out parts outer than these layers, respectively. Further, the first heat dissipation member 13A is connected to the second metal layer in the first exposed region 11e and the second heat dissipation member 13B is connected to the fourth metal layer 24 in the second exposed region 11f. These configurations further improve the heat dissipation effect.

The printed circuit board 10 of the embodiment further has the metallic coating layers 41 provided along the inner walls of the first through hole 39 and the second through hole 40, and the respective layers of the thick metal layers and the heat dissipation member 13 are connected via the metallic coating layers 41. In this case, heat is transferred from the thick metal layers to the heat dissipation member 13 via the metallic coating layers 41, and thereby, the heat dissipation effect may be stably obtained independent of the heat conductivity or contact condition of the fixing members 14 inserted into the above described through holes.

In the printed circuit board 10 of the embodiment, the thick metal layers include the thick metal layers connected to the ground terminal 12g and the thick metal layers connected to the power supply terminal 12d. According to the configuration, the heat generated in the electronic device 12 is transferred to both the thick metal layers, and the heat dissipation effect may be significantly improved.

The printed circuit board 10 of the embodiment includes the differential transmission lines 17 and the first metal layer 21 with the differential transmission lines 17 formed thereon are not made thicker for improvement of the heat dissipation property, and thereby, fluctuations of characteristic impedance may be suppressed and reduction in signal quality may be suppressed. Further, the heat of the electronic device 12 is efficiently released and stability of signal transmission may be secured. For example, when the printed circuit board 10 is applied to an information communication apparatus, the signal amplitude may be made smaller in the differential transmission than that in the single-ended transmission, and thereby, the transmission speed of data may be made faster.

Note that, in the embodiment, the first exposed region 11e is provided in the second metal layer 22 to which the ground terminal 12g of the electronic device 12 is connected and the second exposed region 11f is provided in the fourth metal layer 24 to which the power supply terminal 12d of the electronic device 12 is connected, however, the configuration is not limited to that. The first exposed region 11e may be provided in the seventh metal layer 27 by cutting out a part of the metal layer 20 and a part of the insulating layer 30 on the outside from the seventh metal layer 27, and the second exposed region 11f may be provided in the fifth metal layer 25 by cutting out a part of the metal layer 20 and a part of the insulating layer 30 on the outside from the fifth metal layer 25.

In the embodiment, the ground terminal 12g of the electronic device 12 is connected to the two thick metal layers of the second metal layer 22 and the seventh metal layer 27 and the power supply terminal 12d of the electronic device 12 is connected to the two thick metal layers of the fourth metal layer 24 and the fifth metal layer 25, however, the configuration is not limited to that. It is only necessary that the ground terminal 12g and the power supply terminal 12d of the electronic device 12 are respectively connected to at least the single thick metal layer. When the ground terminal 12g and the power supply terminal 12d are respectively connected to two or more metal layers 20, the thick metal layer is used for at least the metal layer 20 closer to the electronic device 12, and thereby, the amount of heat conduction from the electronic device 12 may be made larger in the thick metal layer and the heat dissipation effect may be further improved.

In the embodiment, the thicknesses of the four thick metal layers of the second metal layer 22, fourth metal layer 24, fifth metal layer 25, and seventh metal layer 27 are the same, however, not limited to that. The respective thicknesses may be different or thicknesses of part of the thick metal layers may be the same.

In the embodiment, the metallic coating layers 41 are respectively provided along the inner walls of the first through hole 39 and the second through hole 40, however, not limited to that. For example, the metallic coating layers 41 may be provided on the inner walls of the hole portions into which the respective fixing members 14A, 14B are inserted in the first heat dissipation member 13A and the second heat dissipation member 13B in addition to the inner walls of the first through hole 39 and the second through hole 40.

Second Embodiment

As below, the second embodiment of the invention will be explained using FIG. 5.

The basic configuration of a printed circuit board of the second embodiment is nearly the same as that of the first embodiment, but different from that of the first embodiment in the layer configuration and the connecting structure of the heat dissipation member. Accordingly, the explanation of the whole printed circuit board will be omitted.

Figure 5:
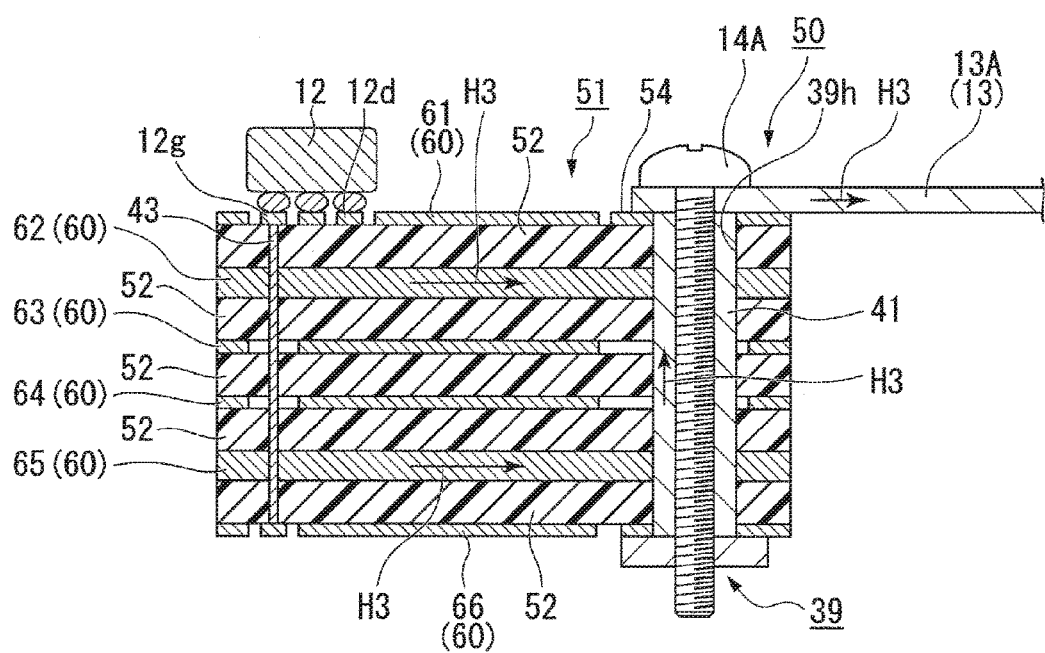
FIG. 5 is a sectional view of a printed circuit board of the second embodiment.

FIG. 5 is a sectional view of the printed circuit board of the second embodiment. FIG. 5 corresponds to FIG. 3 in the first embodiment.

In FIG. 5, the component elements in common with FIG. 3 have the same signs and their explanation will be omitted.

As shown in FIG. 5, in a printed circuit board 50 of the embodiment, a printed wiring board 51 includes a plurality of metal layers 60 and a plurality of insulating layers 52. The printed wiring board 11 of the first embodiment includes the eight metal layers 20 and the seven insulating layers 30. On the other hand, the printed wiring board 51 of the embodiment includes six metal layers 60 and five insulating layers 52. These metal layers 60 and insulating layers 52 are stacked alternately one by one so that the outermost two layers in the printed wiring board 51 may be the metal layers 60.

The plurality of metal layers 60 include a front-side metal layer (first outer metal layer) and a back-side metal layer (second outer metal layer) located on the outermost side in the stacking direction of the printed wiring board 51 of the plurality of metal layers 60, and intermediate metal layers located between the front-side metal layer and the back-side metal layer. In the embodiment, the first metal layer 61 is the front-side metal layer, the sixth metal layer 66 is the back-side metal layer, and the four metal layers 60 from the second metal layer 62 to the fifth metal layer 65 are the intermediate metal layers.

At least one metal layer of the intermediate metal layers is a thick metal layer thicker than the first metal layer 61 as the front-side metal layer and the sixth metal layer 66 as the back-side metal layer. In the embodiment, the second metal layer 62 and the fifth metal layer 65 are thick metal layers. Further, in the embodiment, the second metal layer 62 and the fifth metal layer 65 as the thick metal layers are thicker than the third metal layer 63 and the fourth metal layer 64 as the other intermediate metal layers. The thicknesses of the second metal layer 62 and the fifth metal layer 65 are e.g. 70 μm, and the thicknesses of the other first metal layer 61, third metal layer 63, fourth metal layer 64, and sixth metal layer 66 are e.g. 35 μm.

The second metal layer 62 and the fifth metal layer 65 as the thick metal layers are connected to the ground terminal 12g of the electronic device 12 via the first via 43. Further, though not shown in FIG. 5, the respective third metal layer 63 and fourth metal layer 64 are connected to the power supply terminal 12d or a signal terminal of the electronic device 12. The respective first metal layer 61 and sixth metal layer 66 are connected to the signal terminal of the electronic device 12. Accordingly, the respective second metal layer 62 and fifth metal layer 65 are formed as solid patterns. Further, the respective third metal layer 63 and fourth metal layer 64 are formed as solid patterns when connected to the power supply terminal 12d and formed as wiring patterns when connected to the signal terminal. The respective first metal layer 61 and sixth metal layer 66 are formed as wiring patterns.

The printed circuit board 10 of the first embodiment includes the exposed regions (first exposed region 11e and second exposed region 11f) in which parts of the thick metal layers are exposed to the outside. On the other hand, the printed circuit board 50 of the embodiment does not include the above described exposed regions. As a part of the first metal layer 61, a ground pattern 54 electrically insulated from the wiring pattern connected to the signal terminal of the electronic device 12 is formed. The first through hole 39 is provided to penetrate all of the six metal layers 60 and the five insulating layers 52. The first heat dissipation member 13A is connected to the ground pattern 54 of the first metal layer 61 in which the opening portion 39h of the first through hole 39 is provided. The fixing member 14A is inserted into the first through hole 39 and fixes the first heat dissipation member 13A to the printed wiring board 51.

Heat Conduction Path

In FIG. 5, an arrow H3 shows a conduction path of heat generated in the electronic device 12 via the ground terminal 12g like the arrow H1 in FIG. 3. The heat generated in the electronic device 12 is transferred to the second metal layer 62 and the fifth metal layer 65 via the ground terminal 12g and the first via 43. The heat transferred to the second metal layer 62 and the fifth metal layer 65 is transferred to the first heat dissipation member 13A fixed to the first metal layer 61 via the metallic coating layer 41 and the fixing member 14A. The heat transferred to the first heat dissipation member 13A is dissipated directly to the outside from the first heat dissipation member 13A or, when the first heat dissipation member 13A is connected to another member such as a casing of an electronic apparatus, dissipated via the other member to the outside.

Also, in the embodiment, the same advantage that the printed circuit board 50 not upsized with better heat dissipation effect may be provided as that of the first embodiment may be obtained.

Note that, also, in the embodiment, like the above described first embodiment, it is only necessary that the ground terminal 12g of the electronic device 12 is connected to at least one thick metal layer and, as the thick metal layer to which the ground terminal 12g is connected is closer to the electronic device 12, the heat dissipation effect may be further improved. Further, the thicknesses of the second metal layer 62 and the fifth metal layer 65 as the thick metal layers may be different from each other. Furthermore, the metallic coating layer 41 may be provided on the inner wall of the hole portion into which the fixing member 14A is inserted in the first heat dissipation member 13A.

Third Embodiment

The third embodiment is a projector including the printed circuit boards 10, 50 of the above described embodiments. The printed circuit boards 10, 50 of the first, second embodiments may be applied to an electronic apparatus including an information communication apparatus such as a projector that transmits and receives picture information and various signals.

Figure 6:
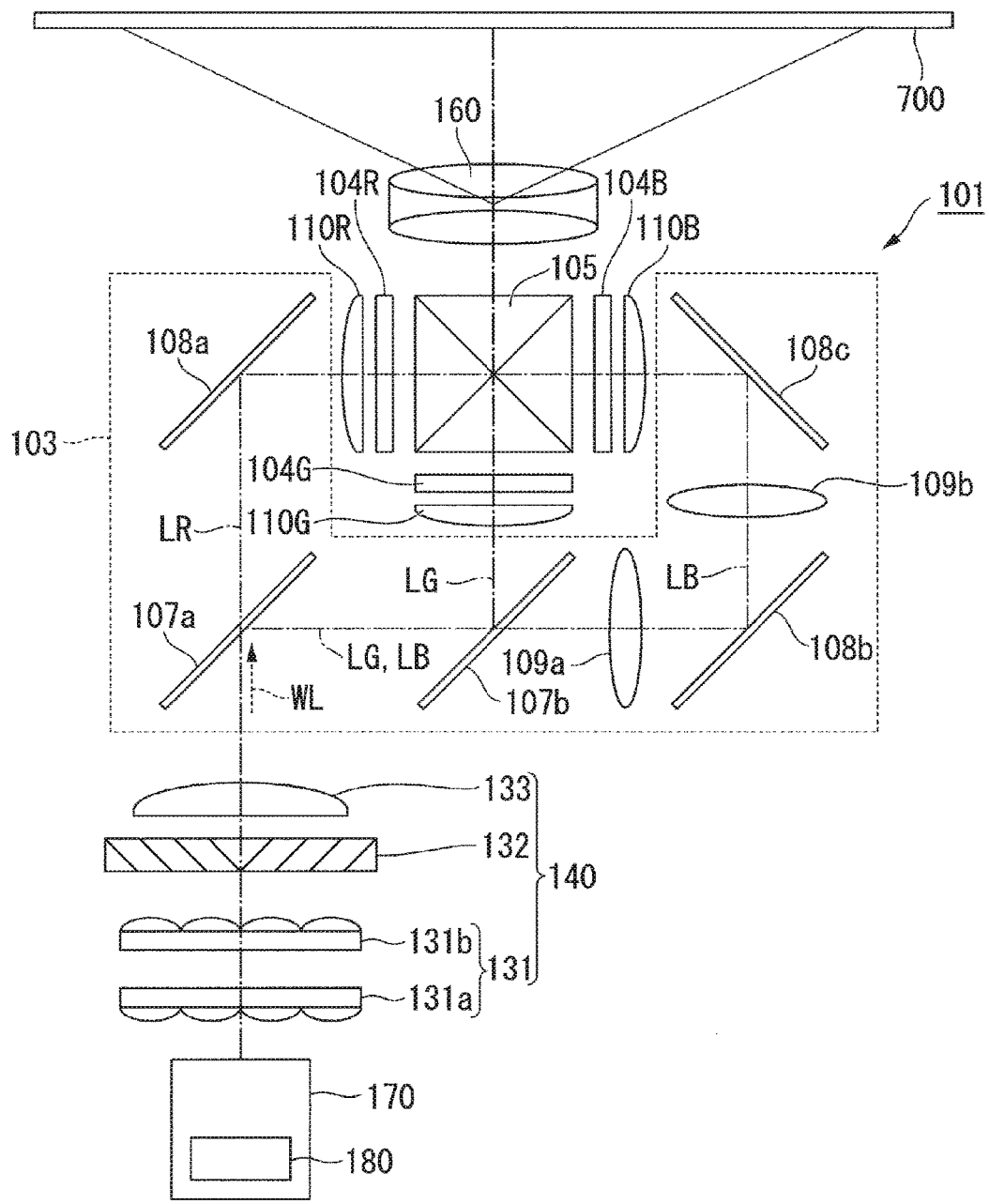
FIG. 6 is a schematic configuration diagram showing a projector of the third embodiment.

FIG. 6 is a schematic configuration diagram showing a projector 101 of the third embodiment.

As shown in FIG. 6, the projector 101 of the embodiment is a projection image display apparatus that displays color images on a screen 700. The projector 101 includes a light source device 170, a homogeneous illumination system 140, a color separation system 103, a light modulation device 104R for red light, a light modulation device 104G for green light, a light modulation device 104B for blue light, a combining system 105, and a projection system 160.

The light source device 170 outputs white illumination light WL toward the homogeneous illumination system 140. The light source device 170 includes a light source (not shown) that outputs a light having a predetermined wavelength. As the light source, various light sources such as a discharge lamp including a high-pressure discharge lamp, a semiconductor laser, or an LED (light emitting diode) are considered.

The homogeneous illumination system 140 includes a homogenizer system 131, a polarization conversion element 132, and a superimposing system 133. The homogenizer system 131 includes a first multi-lens array 131a and a second multi-lens array 131b. The homogeneous illumination system 140 homogenizes intensity distributions of the illumination light WL output from the light source device 170 in the light modulation device 104R, the light modulation device 104G, and the light modulation device 104B as illuminated regions. The illumination light WL output from the homogeneous illumination system 140 enters the color separation system 103.

The color separation system 103 separates the illumination light WL output from the light source device 170 into a red light LR, a green light LG, and a blue light LB. The color separation system 103 includes a first dichroic mirror 107a, a second dichroic mirror 107b, a first reflection mirror 108a, a second reflection mirror 108b, a third reflection mirror 108c, a first relay lens 109a, and a second relay lens 109b.

The first dichroic mirror 107a separates the illumination light WL output from the light source device 170 into the red light LR and a light including the green light LG and the blue light LB. The first dichroic mirror 107a transmits the red light LR and reflects the green light LG and the blue light LB. The second dichroic mirror 107b separates the light reflected by the first dichroic mirror 107a into the green light LG and the blue light LB. The second dichroic mirror 107b reflects the green light LG and transmits the blue light LB.

The first reflection mirror 108a is provided in the optical path of the red light LR. The first reflection mirror 108a reflects the red light LR transmitted through the first dichroic mirror 107a toward the light modulation device 104R. The second reflection mirror 108b and the third reflection mirror 108c are provided in the optical path of the blue light LB. The second reflection mirror 108b and the third reflection mirror 108c guide the blue light LB transmitted through the second dichroic mirror 107b to the light modulation device 104B. The green light LG is reflected by the second dichroic mirror 107b and travels toward the light modulation device 104G.

The first relay lens 109a and the second relay lens 109b are provided on the light exiting side of the second dichroic mirror 107b in the optical path of the blue light LB. The first relay lens 109a and the second relay lens 109b compensate for the light loss of the blue light LB due to the optical path length of the blue light LB longer than the optical path lengths of the red light LR and the green light LG.

The respective light modulation devices 104R, 104G, 104B modulate the light output from the light source device 170 according to image signals. The light modulation device 104R modulates the red light LR according to the image signal and forms an image light corresponding to the red light LR. The light modulation device 104G modulates the green light LG according to the image signal and forms an image light corresponding to the green light LG. The light modulation device 104B modulates the blue light LB according to the image signal and forms an image light corresponding to the blue light LB. For the light modulation device 104R, the light modulation device 104G, and the light modulation device 104B, e.g. transmissive liquid crystal panels are used. Polarizers (not shown) are respectively provided on the light incident sides and the light exiting sides of the liquid crystal panels. The polarizer transmits a linearly-polarized light having a specific polarization direction.

A field lens 110R is provided on the light incident side of the light modulation device 104R. A field lens 110G is provided on the light incident side of the light modulation device 104G. A field lens 110B is provided on the light incident side of the light modulation device 104B. The field lens 110R parallelizes the red light LR entering the light modulation device 104R. The field lens 110G parallelizes the green light LG entering the light modulation device 104G. The field lens 110B parallelizes the blue light LB entering the light modulation device 104B.

The combining system 105 combines the image lights respectively corresponding to the red light LR, the green light LG, and the blue light LB, and outputs the combined image light toward the projection system 160. For the combining system 105, e.g. a cross dichroic prism is used.

The projection system 160 includes a projection lens group including a plurality of projection lenses. The projection system 160 enlarges and projects the image light combined by the combining system 105 toward the screen 700. That is, the projection system 160 projects the lights modulated by the respective light modulation devices 104R, 104G, 104B. Thereby, an enlarged color image is displayed on the screen 700.

Figure 7:
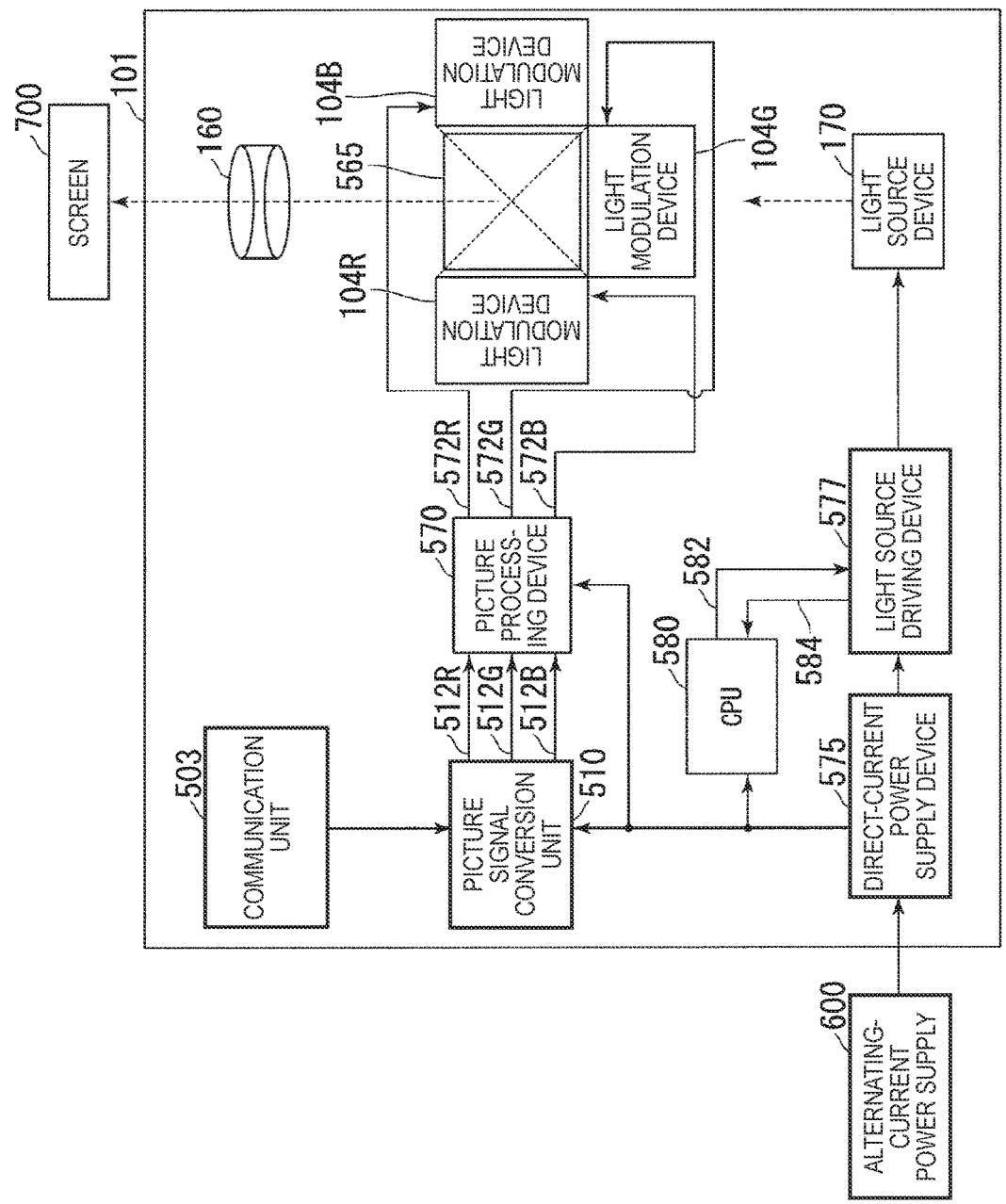
FIG. 7 is a block diagram showing a configuration of a projector.

FIG. 7 shows a configuration of the projector of the embodiment.

As shown in FIG. 7, the projector 101 includes a communication unit 503, a picture signal conversion unit 510, a direct-current power supply device 575, a picture processing device 570, a CPU (Central Processing Unit) 580, and a light source driving device 577 in addition to the configurations shown in FIG. 6.

The picture signal conversion unit 510 converts a picture signal (luminance-color difference signal, analog RGB signal, or the like) externally input into a digital RGB signal having a predetermined word length and generates image signals 512R, 512G, 512B, and supplies the signals to the picture processing device 570.

The picture processing device 570 performs picture processing on the respective three image signals 512R, 512G, 512B. The picture processing device 570 supplies picture signals 572R, 572G, 572B for driving the respective light modulation devices 104R, 104G, 104B to the respective light modulation devices 104R, 104G, 104B.

The direct-current power supply device 575 converts an alternating-current voltage supplied from an external alternating-current power supply 600 into a fixed direct-current voltage. The direct-current power supply device 575 supplies the direct-current voltage to the picture signal conversion unit 510, the picture processing device 570, and the light source driving device 577.

The light source driving device 577 supplies a drive current to the light source device 170 at activation to light the light source device 170.

The light modulation devices 104R, 104G, 104B modulate transmittance of the color lights entering the respective light modulation devices 104R, 104G, 104B based on the picture signals 572R, 572G, 572B, respectively. Note that the respective light modulation devices 104R, 104G, 104B include display driving devices (not shown) that drive the respective light modulation devices 104R, 104G, 104B based on the picture signals 572R, 572G, 572B.

The CPU 580 controls various operations from the start of lighting and extinction of the projector 101. For example, the CPU outputs a lighting command and an extinction command to the light source driving device 577 via a communication signal 582. The CPU 580 receives lighting information of the light source device 170 from the light source driving device 577 via a communication signal 584.

The communication unit 503 is controlled by the CPU 580 and transmits and receives picture information etc. in wireless or wired communications between an information transfer apparatus (not shown) and itself. When receiving picture information from the information transfer apparatus via communications with the information transfer apparatus, the communication unit 503 outputs the received picture information to the picture signal conversion unit 510 according to the control by the CPU 580. Note that, in the embodiment, the communication unit 503 is connected to the CPU 580 by a control signal line, however, the control signal line is not shown in FIG. 7.

The above described printed circuit board 10 of the first embodiment and printed circuit board 50 of the second embodiment are used in e.g. the projector 101 of the embodiment, for the circuits of the communication unit 503, the CPU 580, and the display drive devices (not shown).

As described above, in the projector 101 of the embodiment, the printed circuit board of the above described embodiment is used, and thereby, deterioration of picture information and signals may be suppressed and the projector with better picture quality may be realized. Further, the printed circuit board according to the invention can be applied to e.g. various information communication apparatuses such as cell phones and liquid crystal display devices that transmit and receive information, not limited to the projector.

Further, in the embodiment, the case where the invention is applied to the transmissive projector is explained, however, the invention can be applied to a reflective projector. Here, "transmissive" refers to a type in which the light modulation devices (liquid crystal light valves) including liquid crystal panels transmit lights. "Reflective" refers to a type in which the light modulation devices (liquid crystal light valves) reflect lights. Note that the light modulation devices are not limited to the liquid crystal panels, but may be e.g. light modulation devices using micromirrors.

In the embodiment, the example of the projector 101 using the three light modulation devices 104R, 104G, 104B is taken, however, the invention can be applied to a projector using only one light modulation device or a projector using four or more light modulation devices.

Note that the technical scope of the invention is not limited to the above described embodiments, but various changes can be made without departing from the scope of the invention.

For example, in the above described embodiments, the example of the printed circuit board including four or more intermediate metal layers is taken, however, e.g. a printed circuit board including intermediate metal layers of two thick metal layers, wherein one intermediate metal layer connected to the ground terminal and the other intermediate metal layer connected to the power supply terminal may be employed. It is appropriately selected a metal layer of the plurality of intermediate metal layers to be the thick metal layer.

Further, the specific configurations including the shapes, dimensions, placements, numbers, etc. of the respective component elements forming the printed circuit board can be appropriately changed. The above described embodiments are explained on the assumption of the rigid-type printed circuit board, however, the invention can be applied to a flexible-type printed circuit board.

The entire disclosure of Japanese Patent Application No. 2017-052403, filed Mar. 17, 2017 is expressly incorporated by reference herein.

What is claimed is:

1. A printed circuit board comprising:
    a plurality of metal layers;
    a plurality of insulating layers provided between the respective metal layers of the plurality of metal layers;
    an electronic device provided on one metal layer of the plurality of metal layers; and
    a fixing member fixing a heat dissipation member with respect to the printed circuit board,
    wherein:
    the plurality of metal layers include a first outer metal layer and a second outer metal layer located on the outermost side of the plurality of metal layers and a plurality of intermediate metal layers located between the first outer metal layer and the second outer metal layer,
    at least one of the plurality of intermediate metal layers is a thick metal layer thicker than the first outer metal layer and the second outer metal layer,
    the thick metal layer is connected to one of a ground terminal of the electronic device and a power supply terminal of the electronic device,
    a first through hole penetrates the plurality of metal layers and the plurality of insulating layers, the first through hole being defined by an inner wall, a metallic coating layer being provided on the inner wall of the first through hole,
    a second through hole penetrates an entire thickness of the heat dissipation member,
    the fixing member is inserted into the first through hole and the second through hole, and
    the thick metal layer and the heat dissipation member (i) are directly connected to the metallic coating layer, and (ii) have surfaces that are directly in contact with each other, each of the surfaces extending in a direction orthogonal to a penetrating direction of the first through hole.

2. The printed circuit board according to claim 1, wherein the heat dissipation member is connected to one of the plurality of metal layers in which an opening portion of the first through hole is provided.

3. An electronic apparatus comprising the printed circuit board according to claim 2.

4. The printed circuit board according to claim 1, wherein:
    the heat dissipation member is connected to one of the plurality of metal layers in which an opening portion of the first through hole is provided,
    the thick metal layer has an exposed region exposed to the outside by cutting out a part of at least one of the metal layers and a part of at least one of the insulating layers from a side of one metal layer of the first outer metal layer and the second outer metal layer toward a side of the other metal layer, the opening portion of the first through hole is provided in the exposed region of the thick metal layer, and the heat dissipation member is connected to the thick metal layer in the exposed region.

5. An electronic apparatus comprising the printed circuit board according to claim 4.

6. The printed circuit board according to claim 1, wherein:

the plurality of intermediate metal layers includes a plurality of the thick metal layers, and the plurality of thick metal layers includes a first thick metal layer connected to the ground terminal and a second thick metal layer connected to the power supply terminal.

7. An electronic apparatus comprising the printed circuit board according to claim 6.

8. The printed circuit board according to claim 1, further comprising a differential transmission line formed as a part of the metal layer on which the electronic device is provided, the differential transmission line having a first wire and a second wire.

9. An electronic apparatus comprising the printed circuit board according to claim 8.

10. An electronic apparatus comprising the printed circuit board according to claim 1.

11. A printed circuit board comprising:

a plurality of metal layers;

a plurality of insulating layers provided between the respective metal layers of the plurality of metal layers;

an electronic device provided on one metal layer of the plurality of metal layers; and a fixing member fixing a heat dissipation member with respect to the printed circuit board, wherein:

the plurality of metal layers include a first outer metal layer and a second outer metal layer located on the outermost side of the plurality of metal layers, and an intermediate metal layer located between the first outer metal layer and the second outer metal layer, the intermediate metal layer is a thick metal layer thicker than the first outer metal layer and the second outer metal layer, the thick metal layer is connected to one of a ground terminal of the electronic device and a power supply terminal of the electronic device, a first through hole penetrates the plurality of metal layers and the plurality of insulating layers, the first through hole being defined by an inner wall, a metallic coating layer being provided on the inner wall of the first through hole, a second through hole penetrates an entire thickness of the heat dissipation member, the fixing member is inserted into the first through hole and the second through hole, and the thick metal layer and the heat dissipation member: (i) are directly connected to the metallic coating layer, and (ii) have surfaces that are directly in contact with each other, each of the surfaces extending in a direction orthogonal to a penetrating direction of the first through hole.

12. The printed circuit board according to claim 11, wherein the heat dissipation member is connected to one of the plurality of metal layers in which an opening portion of the first through hole is provided.

13. An electronic apparatus comprising the printed circuit board according to claim 12.

14. The printed circuit board according to claim 11, wherein:

the heat dissipation member is connected to one of the plurality of metal layers in which an opening portion of the first through hole is provided, the thick metal layer has an exposed region exposed to the outside by cutting out a part of at least one of the metal layers and a part of at least one of the insulating layers from a side of one metal layer of the first outer metal layer and the second outer metal layer toward a side of the other metal layer, the opening portion of the first through hole is provided in the exposed region of the thick metal layer, and the heat dissipation member is connected to the thick metal layer in the exposed region.

15. An electronic apparatus comprising the printed circuit board according to claim 14.

16. The printed circuit board according to claim 11, further comprising a differential transmission line formed as a part of the metal layer on which the electronic device is provided, the differential transmission line having a first wire and a second wire.

17. An electronic apparatus comprising the printed circuit board according to claim 11.

* * * * *